(12) United States Patent
Rong et al.

(10) Patent No.: US 7,705,654 B2
(45) Date of Patent: Apr. 27, 2010

(54) FAST TURN ON ACTIVE DCAP CELL

(75) Inventors: Peng Rong, Campbell, CA (US); Lihui Cao, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 162 days.

(21) Appl. No.: 12/129,115

(22) Filed: May 29, 2008

(65) Prior Publication Data

US 2009/0295470 A1 Dec. 3, 2009

(51) Int. Cl.
*H03K 17/04* (2006.01)
(52) U.S. Cl. ....................... 327/376; 327/427
(58) Field of Classification Search ................ 327/376, 327/427, 537, 545, 546, 551
See application file for complete search history.

(56) References Cited

U.S. PATENT DOCUMENTS 5,631,492 A * 5/1997 Ramus et al. ............... 257/532
6,304,124 B1 * 10/2001 Mizuno ...................... 327/281
7,495,878 B2 * 2/2009 Todd .......................... 361/111
7,551,018 B2 * 6/2009 Hsu et al. .................... 327/536

* cited by examiner

*Primary Examiner*—Lincoln Donovan
*Assistant Examiner*—Hai L Nguyen
(74) *Attorney, Agent, or Firm*—Trexler, Bushnell Giangiorgi, Blankstone & Marr, Ltd.

(57) ABSTRACT

A fast active DCAP cell which has a short turn-on time, achieves a high capacitance density, and which minimizes leakage overhead during its normal operation mode is disclosed. The DCAP cell has a pair of PMOS transistors that have their drains connected to a gate of a PMOS transistor and their sources connected to the VDD rail. The drain and source of the PMOS transistor are connected to the VSS rail. Likewise, the DCAP cell has a pair of NMOS transistors that have their drains connected to a gate of an PMOS transistor and their sources connected to the VSS rail. The drain and source of the PMOS transistor are connected to the VDD rail. None of the gates of the transistors is connected to the VDD or VSS rail. This protects the gate oxide from being damaged by ESD surge currents.

8 Claims, 2 Drawing Sheets

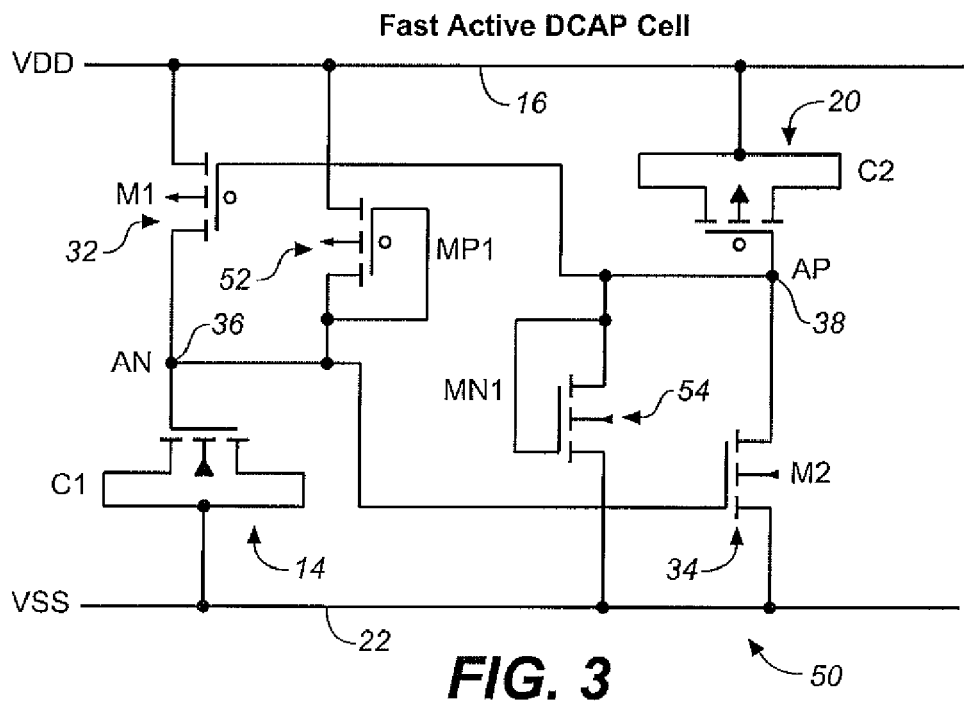

Fast Active DCAP Cell

FIG. 3

Table: Capacitance Density

|  | Frequency | Passive DCAP | Active DCAP | Fast Active DCAP | Improvement from Active DCAP |
|---|---|---|---|---|---|
| Capacitance Density (TT, 1.0v, 25°C) (nF/mm$^2$) | 2GHz | 2.84 | 6.40 | 6.21 | -2.94% |
|  | 4GHz | 2.84 | 6.36 | 6.06 | -4.62% |

FIG. 4

Table: Turn-on Time and Leakage Current

|  | Corner | Active DCAP | Fast Active DCAP | Improvement from Active DCAP |
|---|---|---|---|---|
| Turn-on Time (nS) | Fastest (FF, 1.1v, 125°C) | 1.03 | 0.197 | 5.2X |
|  | Typical (TT, 1.0v, 25°C) | 5.24 | 0.271 | 19.3X |
|  | Slowest (SS, 0.9v, -55°C) | 45.2 | 0.585 | 76.6X |
| Leakage (nA) | Worst (FF, 1.1v, 125°C) | 470 | 462 | -1.7% |

FAST TURN ON ACTIVE DCAP CELL

BACKGROUND

The present invention generally relates to multi-threshold complimentary metal oxide semiconductor (MTCMOS) designs, and more specifically relates to a fast turn-on active decoupling capacitance (DCAP) cell which can be utilized in a MTCMOS design.

For MTCMOS designs, a very short turn-on time is required for each block which has been previously powered down. All DCAP cells in a MTCMOS block have to be fully charged before the block starts to function, which imposes a stringent limit on the turn-on time of a DCAP cell that could be used in MTCMOS block.

FIG. 1 illustrates one type of prior art DCAP cell. The cell 10 is passive, and provides that a passive resistor ("R1", identified with reference numeral 12 in FIG. 1) connects the gate 13 of an NMOS transistor ("C1", identified with reference numeral 14 in FIG. 1) to the VDD rail 16, and another passive resistor ("R2", identified with reference numeral 18 in FIG. 1) connects the gate 19 of a PMOS transistor ("C2", identified with reference numeral 20 in FIG. 1) to the VSS rail 22. The cell 10 shown in FIG. 1 has a short turn-on time, but in order to minimize effective capacitance loss which is experienced at high-frequency power noises, each of the two passive resistors 12, 18 have to be provided as being sufficiently large (area) enough to make their resistance sufficiently small, which consequently leads to the major drawback of a DCAP cell which employs passive resistors—low capacitance density.

FIG. 2 illustrates another type of prior art DCAP cell—an active DCAP cell. Like the passive DCAP cell 10 shown in FIG. 1, the active DCAP cell 30 shown in FIG. 2 includes an NMOS transistor 14 and a PMOS transistor 20. However, instead of using passive resistors 12, 18 like the DCAP cell 10 shown in FIG. 1, the active DCAP cell 30 shown in FIG. 2 uses two active transistors ("M1" and "M2", identified with reference numerals 32 and 34, respectively, in FIG. 2). When the DCAP cell 30 is fully charged, both of the transistors 32, 34 are in saturation mode and have a small resistance. Due to the transistors 32, 34 having a small resistance in saturation mode, they can be provided as being relatively small. In fact, the transistors 32, 34 in the DCAP cell 30 shown in FIG. 2 can be provided as being much smaller than the passive resistors 12, 18 of the DCAP cell 10 shown in FIG. 1. As such, the DCAP cell 30 shown in FIG. 2 successfully achieves much higher capacitance density than the DCAP cell 10 shown in FIG. 1, and ultimately reduces the chip die size. However, at the beginning of a charging, when the voltage level on the VDD rail 16 suddenly rises from 0 to VDD (due to, for example, the switch header cell being activated), because voltage across a capacitor cannot change immediately, the voltage at node "AN" (identified with reference numeral 36 in FIG. 1) remains at VSS while the voltage at node "AP" (identified with reference numeral 38 in FIG. 1) reaches VDD. Thus at this stage, both of the transistors 32, 34 are turned-off, leaving the NMOS and PMOS transistors 14, 20 to charge slowly as they receive very small leakage currents. It takes a long time to progress to the point to where AN and AP reach the threshold voltages of transistors 14, 20 and turn them on. Also, the turn-on time of the active DCAP cell 30 shown in FIG. 2 is highly dependent on the process, voltage and temperature corner, which makes the ability to control the activation of the MCTMOS block problematical.

OBJECTS AND SUMMARY

An object of an embodiment of the present invention is to provide a DCAP cell which has a short turn-on time.

Another object of an embodiment of the present invention is to provide a DCAP cell which achieves a high capacitance density.

Yet another object of an embodiment of the present invention is to provide a DCAP cell which minimizes leakage overhead during its normal operation mode.

Briefly, and in accordance with at least one of the foregoing objects, an embodiment of the present invention provides a DCAP cell that has a pair of PMOS transistors that have their drains connected to a gate of an NMOS transistor and their sources connected to the VDD rail. The drain and source of the NMOS transistor are connected to the VSS rail. Likewise, the DCAP cell has a pair of NMOS transistors that have their drains connected to a gate of a PMOS transistor and their sources connected to the VSS rail. The drain and source of the PMOS transistor are connected to the VDD rail. None of the gates of the transistors is connected to the VDD or VSS rail. This protects the gate oxide from being damaged by the ESD surge currents which are on the rails.

BRIEF DESCRIPTION OF THE DRAWINGS

The organization and manner of the structure and operation of the invention, together with further objects and advantages thereof, may best be understood by reference to the following description, taken in connection with the accompanying drawings, wherein:

FIG. 3 illustrates a fast active DCAP cell which is in accordance with an embodiment of the present invention;

FIG. 4 is a table which illustrates how the fast active DCAP cell shown in FIG. 3 provides improved capacitance density, compared to the prior art DCAP cells shown in FIGS. 1 and 2; and FIG. 5 is a table which illustrates how the fast active DCAP cell shown in FIG. 3 provides improved turn-on time and leakage current, compared to the prior art DCAP cells shown in FIGS. 1 and 2.

DESCRIPTION

Figure 1:
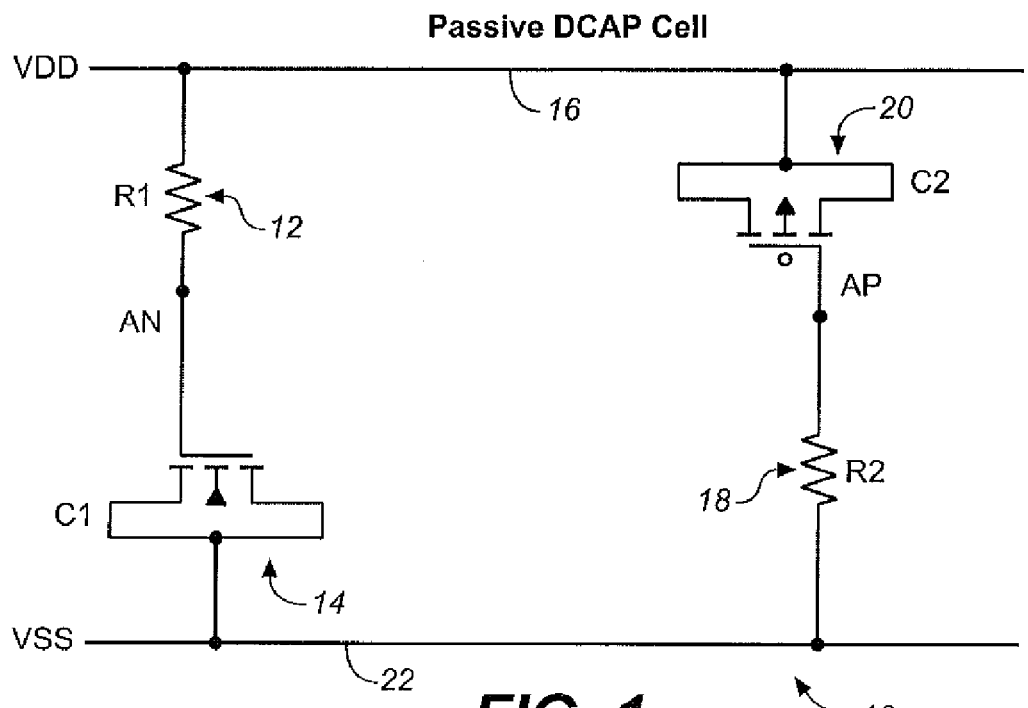
FIG. 1 illustrates a prior art passive DCAP cell that uses two passive resistors.

While the invention may be susceptible to embodiment in different forms, there is shown in the drawings, and herein will be described in detail, a specific embodiment of the invention. The present disclosure is to be considered an example of the principles of the invention, and is not intended to limit the invention to that which is illustrated and described herein.

Figure 2:
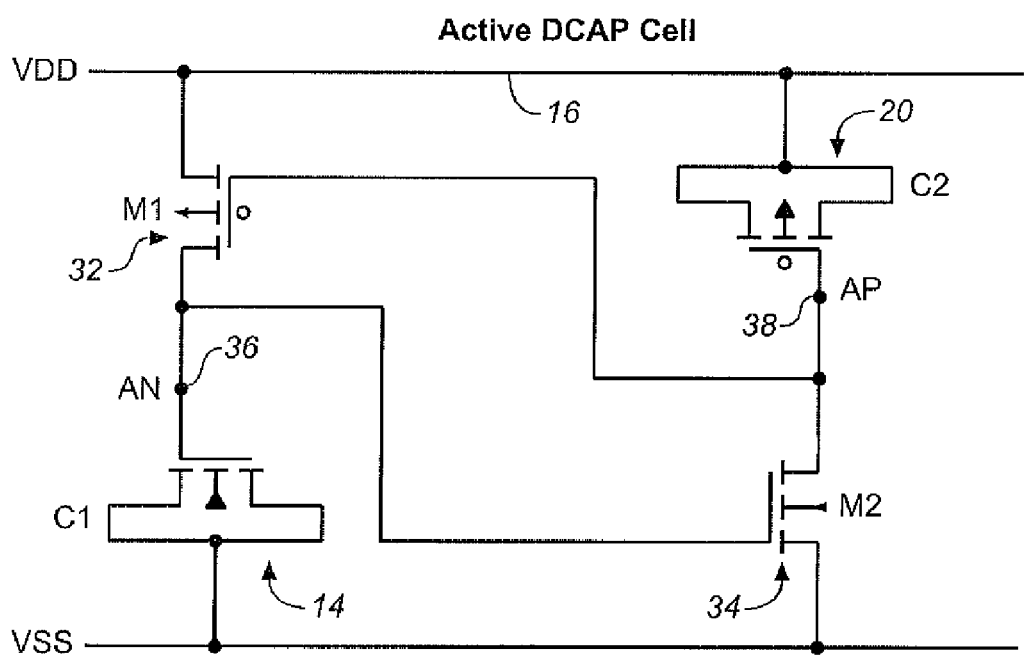
FIG. 2 illustrates a prior art active DCAP cell that uses two active transistors instead of passive resistors.

FIG. 3 illustrates a fast active DCAP cell 50 which is in accordance with an embodiment of the present invention. Like the active DCAP cell 30 which is shown in FIG. 2, the fast active DCAP cell 50 which is shown in FIG. 3 includes active transistors "M1" and "M2" (identified with reference numerals 32 and 34, respectively), as well as an NMOS transistor ("C1", identified with reference numeral 14) and a PMOS transistor ("C2", identified with reference numeral 20). However, compared to the active DCAP cell 30 shown in FIG. 2, the fast active DCAP cell 50 shown in FIG. 3 includes two additional transistors—an additional PMOS transistor ("MP1", identified with reference numeral 52 in FIG. 3) which has both its gate and drain connected to the AN node 36, and an additional NMOS transistor ("MN1", identified with reference numeral 54 in FIG. 3) which has both its gate and drain connected to the AP node 38. As shown in FIG. 3, none of the transistor gates are directly connected to the power (VDD 16) or ground (VSS 22) rail. This protects the gate oxide from being damaged by the ESD surge currents which are on the rails.

In operation, at the beginning of a charge, when the voltage level of the power rail 16 rises from VSS to VDD, since the voltage at node AN is VSS, transistor MP1 (identified with reference numeral 52 in FIG. 3) is in saturation mode and is able to supply a large amount of charge current to NMOS transistor C1 (identified with reference numeral 14 in FIG. 3), which rapidly increases the voltage at node AN to the threshold voltage of transistor M2 (identified with reference numeral 34 in FIG. 3). Once turned on, transistor M2 helps in charging PMOS transistor C2 (identified with reference numeral 20 in FIG. 3), which speeds up the voltage transition at node AP. The same thing happens to NMOS transistor MN1 (identified with reference numeral 54 in FIG. 3). When the fast active DCAP cell 50 is fully charged, the voltage at the AN node reaches VDD and the voltage at the AP node drops to VSS, which puts both of the transistors M1 and M2 into saturation mode. This, in turn, results in small series resistance and consequently guarantees high effective capacitance in front of power noises in gigahertz.

Spice simulations were run on three different types of DCAP cells—a "passive DCAP" cell consistent with that which is illustrated in FIG. 1; an "active DCAP" cell consistent with that which is illustrated in FIG. 2; and a "fast active DCAP" cell consistent with that which is illustrated in FIG. 3. FIGS. 4 and 5 contain tables which list the data from the simulations.

As shown in FIGS. 4 and 5, compared to active DCAP cells (like shown in FIG. 2), the turn-on time of a fast active DCAP cell (like shown in FIG. 3) is, on average, reduced by 5 times at the fastest corner, 20 times at a typical corner, and 75 times at the slowest coiner. The turn-on time is also within a narrow range for the fast active DCAP cell, which makes MTCMOS implementation much easier. As shown in the table in FIG. 4, the fast active DCAP cell (like shown in FIG. 3) has a small loss in capacitance density, which is between 2.5 and 5 percent at 2-4 GHz, but (as shown in the table in FIG. 5) dissipates around 2 percent less leakage current compared to an active DCAP cell (like shown in FIG. 2). The three types of cells have similar capacitance values—approximately 30 pF for active DCAP cells (like shown in FIGS. 2 and 3) and approximately 45 pF for passive DCAP cells (like shown in FIG. 1).

The present invention can be used in circuits and logical schemes for new solutions. The fast active DCAP cell disclosed herein achieves short turn-on time and high capacitance density at the same time with minimized leakage current, which makes it very suitable to be used in 65 nm and 45 nm and beyond MTCMOS designs. The fast active DCAP cell disclosed herein can be used in general integrated circuit designs, but is especially appropriate for MTCMOS designs and all other designs where a fast turn-on is required.

While an embodiment of the present invention is shown and described, it is envisioned that those skilled in the art may devise various modifications to the embodiment without departing from the spirit and scope of the present invention.

What is claimed is:

1. A fast active DCAP cell connected to a first rail and to a second rail, said fast active DCAP cell comprising: a first NMOS transistor having its drain and source connected to the first rail, and a first PMOS transistor having its drain and source connected to the second rail, wherein the gate of the first NMOS transistor is connected to the drain of a second PMOS transistor and to the drain of a third PMOS transistor, and the second and third PMOS transistors have their sources connected to the second rail, and wherein the gate of the first PMOS transistor is connected to the drain of a second NMOS transistor and to the drain of a third NMOS transistor, and the second and third NMOS transistors have their sources connected to the first rail, wherein the gate of the third PMOS transistor is connected to the drain of the third PMOS transistor, and the gate of the third NMOS transistor is connected to the drain of the third NMOS transistor.

2. The fast active DCAP cell as recited in claim 1, wherein none of the gates of the transistors are connected directly to the rails.

3. The fast active DCAP cell as recited in claim 1, wherein the gate of the first NMOS transistor, the drain of the second PMOS transistor, and the drain of the third PMOS transistor are connected to the gate of the second NMOS transistor.

4. The fast active DCAP cell as recited in claim 1, wherein the gate of the first PMOS transistor, the drain of the second NMOS transistor, and the drain of the third NMOS transistor are connected to the gate of the second PMOS transistor.

5. The fast active DCAP cell as recited in claim 1, wherein the gate of the first NMOS transistor, the drain of the second PMOS transistor, and the drain of the third PMOS transistor are connected to the gate of the second NMOS transistor, and wherein the gate of the first PMOS transistor, the drain of the second NMOS transistor, and the drain of the third NMOS transistor are connected to the gate of the second PMOS transistor.

6. A fast active DCAP cell connected to a first rail and to a second rail, said fast active DCAP cell comprising:
   a first NMOS transistor, a second NMOS transistor and a third NMOS transistor; a first PMOS transistor, a second PMOS transistor and a third PMOS transistor;
   wherein the first NMOS transistor has its drain and source connected to the first rail, and has its gate connected to the drain of the second and third PMOS transistors, said second and third PMOS transistors having their sources connected to the second rail;
   wherein the first PMOS transistor has its drain and source connected to the second rail, and has its gate connected to the drain of the second and third NMOS transistors, said second and third NMOS transistors having their sources connected to the first rail;
   wherein the gate of the first NMOS transistor, the drain of the second PMOS transistor, and the drain of the third PMOS transistor are connected to the gate of the second NMOS transistor;
   wherein the gate air the first PMOS transistor, the drain of the second NMOS transistor, and the drain of the third NMOS transistor are connected to the gate of the second PMOS transistor;
   wherein none of the gates of the transistor are connected directly to the rails; and
   wherein the gate of the third PMOS transistor is connected to the drain of the third PMOS transistor, and the gate of the third NMOS transistor is connected to the drain of the third NMOS transistor.

7. A fast active DCAP cell connected to a first rail and to a second rail, said fast active DCAP cell comprising:

a first NMOS transistor, a second NMOS transistor and a third NMOS transistor; a frist PMOS transistor, a second PMOS transistor and a third PMOS transistor;

wherein the first NMOS transistor has its drain and source connected to the first rail, and has its gate connected to the drain of the second and third PMOS transistors, said second and third PMOS transistors having their sources connected to the second rail;

wherein the first PMOS transistor has its drain and source connected to the second rail, and has its gate connected to the drain of the second and third NMOS transistors, said second and third NMOS transistors having their sources connected to the first rail;

wherein the gate of the first NMOS transistor, the drain of the second PMOS transistor, and the drain of the third PMOS transistor are connected to the gate of the second NMOS transistor;

wherein the gate of the first PMOS transistor, the drain of the second NMOS transistor, and the drain of the third NMOS transistor are connected to the gate of the second PMOS transistor; and wherein the gate of the third PMOS transistor is connected to the drain of the third PMOS transistor, and the gate of the third NMOS transistor is connected to the drain of the third NMOS transistor.

8. The fast active DCAP cell as recited in claim 7, wherein none of the gates of the transistors are connected directly to the rails.

* * * * *